(12) United States Patent
Wright et al.

(10) Patent No.: US 8,737,076 B2
(45) Date of Patent: May 27, 2014

(54) POWER DISTRIBUTION MODULE FORM FACTOR

(75) Inventors: Randolph Stanton Wright, Lucas, TX (US); Larry O'Neal Reeder, Rockwall, TX (US)

(73) Assignee: Telect, Inc., Liberty Lake, WA (US)

( * ) Notice: Subject to any disclaimer, the term of this patent is extended or adjusted under 35 U.S.C. 154(b) by 1097 days.

(21) Appl. No.: 12/748,174

(22) Filed: Mar. 26, 2010

(65) Prior Publication Data

US 2010/0290605 A1 Nov. 18, 2010

Related U.S. Application Data

(60) Provisional application No. 61/215,990, filed on May 12, 2009.

(51) Int. Cl.
| | | |
|---|---|---|
| *H05K 5/00* | (2006.01) | |
| *H05K 7/00* | (2006.01) | |
| *G06F 1/16* | (2006.01) | |
| *H04Q 1/02* | (2006.01) | |
| *H04Q 1/04* | (2006.01) | |
| *H05K 7/14* | (2006.01) | |
| *H05K 7/18* | (2006.01) | |
| *H02B 1/26* | (2006.01) | |
| *G06F 1/18* | (2006.01) | |

(52) U.S. Cl.
CPC . *H04Q 1/03* (2013.01); *H04Q 1/04* (2013.01); *H04Q 1/155* (2013.01); *H05K 7/1461* (2013.01); *H05K 7/18* (2013.01); *H02B 1/26* (2013.01); *G06F 1/189* (2013.01); *G06F 1/181* (2013.01)

USPC ........... 361/724; 361/643; 361/652; 361/725; 361/726; 361/727

(58) Field of Classification Search
CPC ............. G06F 1/16; G06F 1/18; G06F 1/181; G06F 1/182; G06F 1/189; H02B 1/26; H02B 1/30; H02B 1/34; H05K 5/00; H05K 5/0017; H05K 7/00; H05K 7/14; H05K 7/18; H05K 7/1461; H04Q 1/03; H04Q 1/04; H04Q 1/155
USPC .................. 361/643, 652, 724, 725, 726, 727
See application file for complete search history.

(56) References Cited

U.S. PATENT DOCUMENTS

| | | |
|---|---|---|
| 3,878,436 A | 4/1975 | Bogel |
| 3,916,264 A | 10/1975 | Berg |
| 4,090,088 A | 5/1978 | McMahon et al. |
| 5,357,394 A | 10/1994 | Piney |
| 5,652,893 A | 7/1997 | Ben-Meir et al. |
| 5,787,336 A | 7/1998 | Hirschfield et al. |
| 5,826,170 A | 10/1998 | Hirschfield et al. |
| 5,982,596 A | 11/1999 | Spencer et al. |

(Continued)

OTHER PUBLICATIONS

IMCI Technologies, The Critical Infrastructure Protection Company, retrieved on May 8, 2009 at <<http://www.imci.net/>>, 5 pages.

(Continued)

*Primary Examiner* — Anthony Haughton
(74) *Attorney, Agent, or Firm* — Lee & Hayes, PLLC

(57) ABSTRACT

A modular form factor power module system with monitoring and control functions is disclosed. The power module system is configured to power, monitor and/or control telecommunications equipment at the circuit level.

22 Claims, 16 Drawing Sheets

(56) References Cited

U.S. PATENT DOCUMENTS

| | | | |
|---|---|---|---|
| 6,195,243 B1 | 2/2001 | Spencer et al. | |
| 6,473,281 B1 | 10/2002 | Kornblit | |
| 6,583,523 B1 | 6/2003 | Bhate | |
| 7,015,599 B2 | 3/2006 | Gull et al. | |
| 7,143,300 B2 | 11/2006 | Potter et al. | |
| 7,585,034 B2 * | 9/2009 | Cabrera et al. | 312/350 |
| 7,693,210 B2 | 4/2010 | Margetts et al. | |
| 8,001,403 B2 | 8/2011 | Hamilton et al. | |
| 8,073,554 B2 | 12/2011 | Vezza et al. | |
| 8,135,550 B2 | 3/2012 | Bose et al. | |
| 8,254,563 B2 | 8/2012 | Pan et al. | |
| 8,498,309 B2 * | 7/2013 | Campini et al. | 370/466 |
| 2002/0162032 A1 | 10/2002 | Gundersen et al. | |
| 2003/0023885 A1 | 1/2003 | Potter et al. | |
| 2003/0030954 A1 | 2/2003 | Bax et al. | |
| 2006/0064205 A1 | 3/2006 | Ying | |
| 2007/0008076 A1 | 1/2007 | Rodgers et al. | |
| 2007/0041387 A1 | 2/2007 | Ghoshal et al. | |
| 2007/0046261 A1 * | 3/2007 | Porebski | 320/132 |
| 2007/0058344 A1 | 3/2007 | Baker | |
| 2007/0101173 A1 | 5/2007 | Fung | |
| 2007/0168088 A1 | 7/2007 | Ewing et al. | |
| 2007/0245165 A1 | 10/2007 | Fung | |
| 2008/0204947 A1 | 8/2008 | Shea et al. | |
| 2008/0278889 A1 * | 11/2008 | Briggs et al. | 361/608 |
| 2009/0150100 A1 | 6/2009 | Pifer et al. | |
| 2009/0235097 A1 | 9/2009 | Hamilton et al. | |
| 2010/0097733 A1 | 4/2010 | E. | |
| 2010/0145641 A1 | 6/2010 | Bose et al. | |
| 2010/0208433 A1 * | 8/2010 | Heimann et al. | 361/724 |
| 2010/0290604 A1 | 11/2010 | Wright et al. | |
| 2012/0275575 A1 | 11/2012 | Knight et al. | |
| 2013/0131877 A1 | 5/2013 | Hirose et al. | |

OTHER PUBLICATIONS

Non-Final Office Action for U.S. Appl. 12/748,161, mailed on Decmeber 13, 2012, Randolph Stanton Wright et al., "Power Distribution Module With Monitoring and Control Functions," 10 pages.

* cited by examiner

POWER DISTRIBUTION MODULE FORM FACTOR

RELATED APPLICATIONS

This application claims the benefit of U.S. Provisional Application No. 61/215,990, filed May 5, 2009, which is incorporated herein by reference.

TECHNICAL FIELD

The following disclosure relates generally to power module systems for telecommunications equipment. More specifically, the disclosure relates in some aspects to power module systems including power modules with monitoring and control functions.

BACKGROUND

Remote telecommunications sites (e.g., cellular sites) have presented a challenge during power system upgrades and repair. Previous telecommunications site enclosures have been difficult to upgrade and manage as their non-modular power systems made access to equipment inside the enclosure difficult to remove/repair/upgrade. This is of particular concern during servicing of an enclosure at a remote location.

In addition, many remote telecommunications sites are now subject to new regulations governing the required duration of backup power for cellular phone operations. Specifically, various functions or essential equipment need to continue to operate in the event of a power failure. Existing backup power installations lack the flexibility and control needed to dynamically manage power during a commercial power failure.

SUMMARY

This application describes a dynamic power module system for telecommunications enclosures with monitoring and control functions. The power module system has the ability to, among other things, power, monitor and control telecommunications equipment at the circuit level. In addition, the power module system provides a modular capability to allow easy removal, repair, and upgrade.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

BRIEF DESCRIPTION OF THE DRAWINGS

The detailed description refers to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
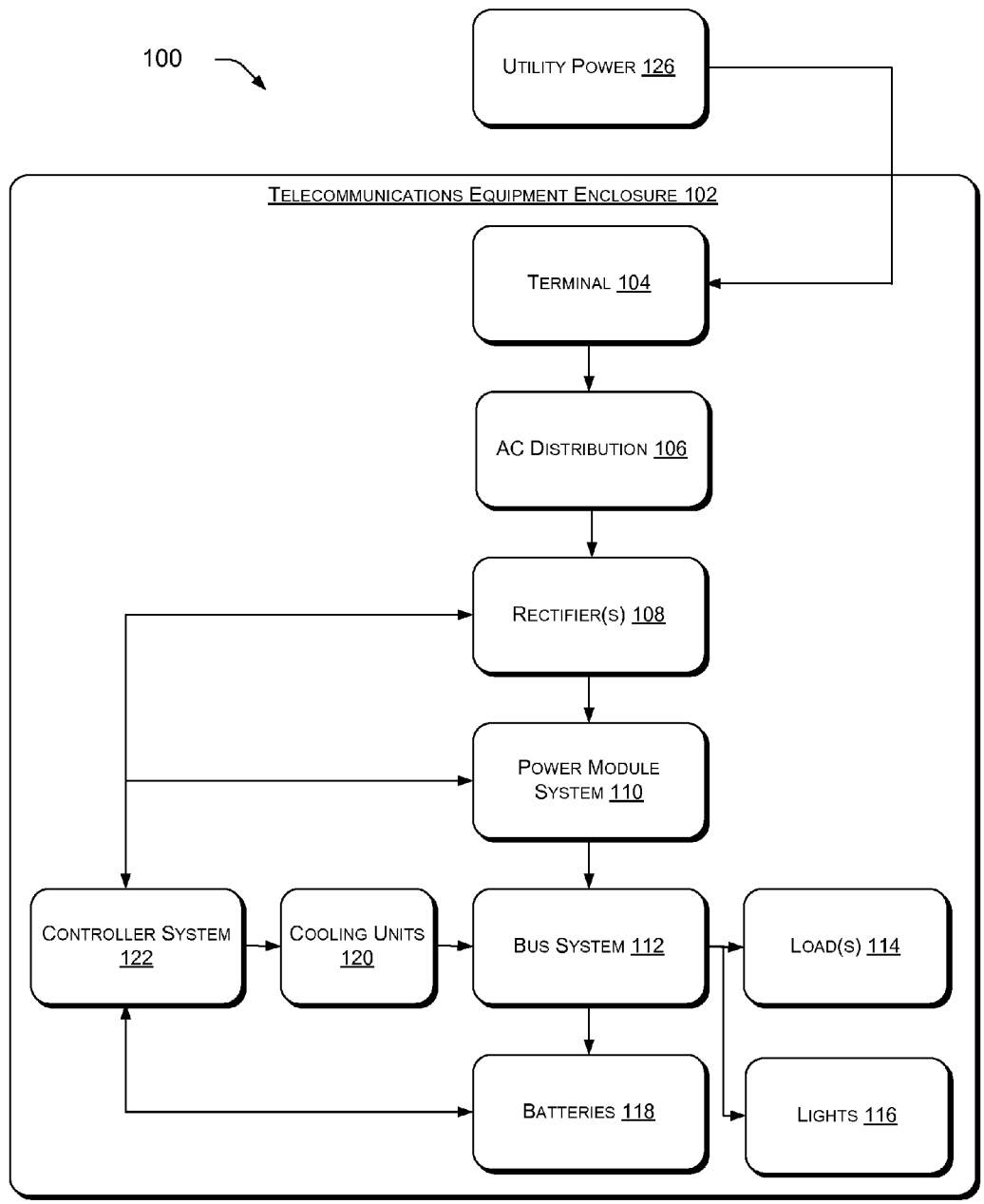
FIG. 1 is a signal flow diagram illustrating an example telecommunications equipment enclosure with a power distribution module system.

As discussed above, upgrading and maintaining telecommunication site power systems is a time consuming and costly endeavor due to the non-modular construction of traditional telecommunications enclosure power systems. Specifically, previous power systems included non-modular hard-coded power systems (e.g. breakers/fuses) in the enclosure that made upgrade and repair difficult or impossible.

A dynamic, modular power distribution system having multiple power distribution modules (hereinafter "power modules") with monitoring and control functions is disclosed. The modularity of the power module system provides economy and flexibility via rack mounted power modules. For instance, each module may be pre-configured for a variety of applications such as power metering, local connection and disconnection, remote actuation, etc.

This modularity offers "plug and play" installation and allows easy reconfiguration simply by swapping out modules as needed for a given load, in contrast to the hard coding of specific power system components in a traditional telecommunications equipment enclosure. Thus, modularity permits easy and flexible configuration during an upgrade/repair without rewiring the telecommunications equipment connections. In other words, the modularity permits a single telecommunications equipment enclosure to be configured to meet a variety of service applications and loads.

In one embodiment, modularity may be via wired connections on the power modules and connection interfaces on the rack unit. These features allow easy configuration and re-configuration of the enclosure by swapping out power modules. The connection interfaces are pre-wired to accommodate a plurality of different telecommunications equipment, which eliminates time consuming re-wiring during upgrade/repairs.

Also, as discussed above, telecommunications sites have previously lacked dynamic power distribution systems. Specifically, existing telecommunications sites have either lacked a power management system altogether or they have had inefficient power management systems. In the latter case, previous systems have lacked the ability to monitor and connect/disconnect telecommunications equipment at the circuit level. Rather, power management decisions were typically made at a remote control center. The ability to monitor and connect/disconnect the telecommunications equipment at the circuit level provides a fine-level of granularity of dynamic power management previously unattainable. Moreover, it was not previously possible to make intelligent decisions and turn equipment on/off at the circuit level locally.

Power module systems described herein employ dynamic power modules with monitoring and control functions. In various embodiments, the power module system has the ability to power, monitor and control telecommunications equipment at the circuit level. Specifically, the power module system described herein presents a protocol agnostic interface. This is in contrast with traditional power management methods which have used connections from an I/O board of the controller to directly interface to the unit of telecommunications equipment. This interface method is complicated, expensive and inflexible. Specifically, specialized and sometimes proprietary protocols and hardware (such as controller board designs) previously had to be used to interface the controller to each different piece of telecommunications equipment and each different source of power.

Some embodiments of the modular power system described herein also provide cost savings relative to existing power management equipment. The modular power system's ability to monitor telecommunications equipment, allow the modular power system to consider the power usage of a unit of telecommunications equipment at the circuit level. This information gives the system detailed information on the amount of power each specific unit is consuming, which in turn allows fine-granularity of "dynamic" decisions to be based on circuit level information that was previously unavailable. For example, the power modular system may monitor and turn off only specific units that are unnecessarily consuming power, or may charge batteries or other power sources during off-peak hours.

Dynamic power management also allows for response to equipment failure. One such instance is if an air conditioner in the telecommunication equipment enclosure fails. If the air conditioner fails, the equipment within the telecommunications equipment enclosure may be in danger of over heating. However, a dynamic modular power system is able to monitor the temperature inside the enclosure, and turn off the appropriate equipment in a particular order of importance, in order to maintain an appropriate temperature inside the enclosure.

The dynamically managed distribution systems described herein may also be applicable during a power outage at a remote telecommunications site. For example, essential equipment such as cellular radios need to be operated as long as possible while on backup power, while other non-essential equipment may be shut down. Dynamically managed distribution systems described herein are usable to power down non-essential equipment and divert remaining battery power to the essential equipment.

In addition, during a commercial power failure, that the dynamic power systems described herein may allow the cellar site to not only power itself, but also to make management decisions locally. For example, during a commercial power failure, communications with an off-site remote operations center may also fail. A point of local control allows the system to continue to run, and even adapt to changing conditions without communicating with a remote operations center.

However, if communication with the remote operations center is possible, a dynamic power distribution system, such as described herein, can offer enhanced power management options. For instance, the power distribution system may monitor the on-site telecommunications equipment whose status may be sent to a remote operations center. In response, the remote operations may aggregate and profile the information and may send instructions back to the power distribution system. These instructions may enhance a controller's ability to make decisions. For instance, the remote operations center may instruct the controller to turn off appropriate telecommunications equipment during the times of peak power prices. Alternatively, the remote operations may coordinate control of the power management system in concert with power management systems at other remote telecommunications sites (e.g., to manage a coverage area).

The implementations above are described in the context of power module systems for accommodating the circuit level needs of telecommunication equipment at a remote telecommunications site. However, the implementations described herein may be used in other environments and are applicable to other contexts such as local sites (e.g., utility transmission and/or distribution sites) and may be used with other electrical, mechanical, computer or a variety of other equipment.

Illustrative Architecture of a Modular Power System

FIG. 1 illustrates an illustrative architecture 100 of an enclosure 102 with a power module system 110 according to one exemplary implementation. As illustrated, FIG. 1 shows a non-limiting example of a telecommunications equipment enclosure 102 (herein enclosure).

In this non-limiting embodiment, enclosure 102 houses a plurality of equipment powered by utility power 126. Utility power 126 is typically AC power ranging from 110 volts to 240 volts and may be connected to terminal 104 via a transfer switch. The transfer switch may also be connected to an on-site generator, batteries, fuel cell stack, solar array, wind turbines, and/or other source of back-up power. Terminal block 104 is in turn connected internally in enclosure 102 to an AC distribution system 106. The AC distribution system 106 splits the AC power form the terminal block and provides incoming and outgoing power protection. For instance, the outgoing power may include feeds to rectifier(s) 108 or AC outlets (not shown) which may be used to power equipment that runs on AC power.

Rectifier(s) 108 serves to convert the AC utility power 126 into DC power to supply one or more pieces of telecommunications equipment. One example of a rectifier system is the Powerware product line available from Eaton, Inc. of Cleveland, Ohio. Connected to the rectifier(s) 108 is power module system 110. Power module system 110 serves to provide circuit level control of telecommunications equipment in a convenient and modular manner. More specifically, the power module system 110 comprises a pre-wired connection on both a power module and a rack unit which serves to eliminate the need for re-wiring/reconnecting telecommunications equipment when a power module is changed. In other words, the telecommunications equipment, rectifier and controller remain connected to the rack unit connection interface, while a plurality of power distribution modules conveniently are interchangeably docked with the rack unit connection interface via a pre-wired modular enclosure connection. Each power distribution module may feature monitoring and control functions. This allows modular circuit level control with a minimum of installation/configuration cost.

In turn, the power module system 110 may be connected to a bus bar 112 or other connection. Bus bar 112 serves to isolate a circuit comprising a rectifier, a power module and a load 114 (e.g., cellular radio or other telecommunications equipment) via a load bar. Thus, the bus bar 112 serves as a circuit isolation mechanism to prevent electrical interference between various circuits. As shown, the bus bar 112 may also be connected to batteries 118 to provide back-up power.

Controller system 122 may be connected to rectifier(s) 108, power module system 110, bus bar 112, cooling units 120, and batteries 118. The controller system 122 provides intelligent decision making capability for the circuit level control of the loads 114. In addition, controller system 122 may process and make decisions based on information from the components it is connected to. For instance, the controller system may activate an air conditioner via modular circuit level control based on received temperature readings. The control system may also be connected to the Internet to send/receive instructions etc.

Figure 2:
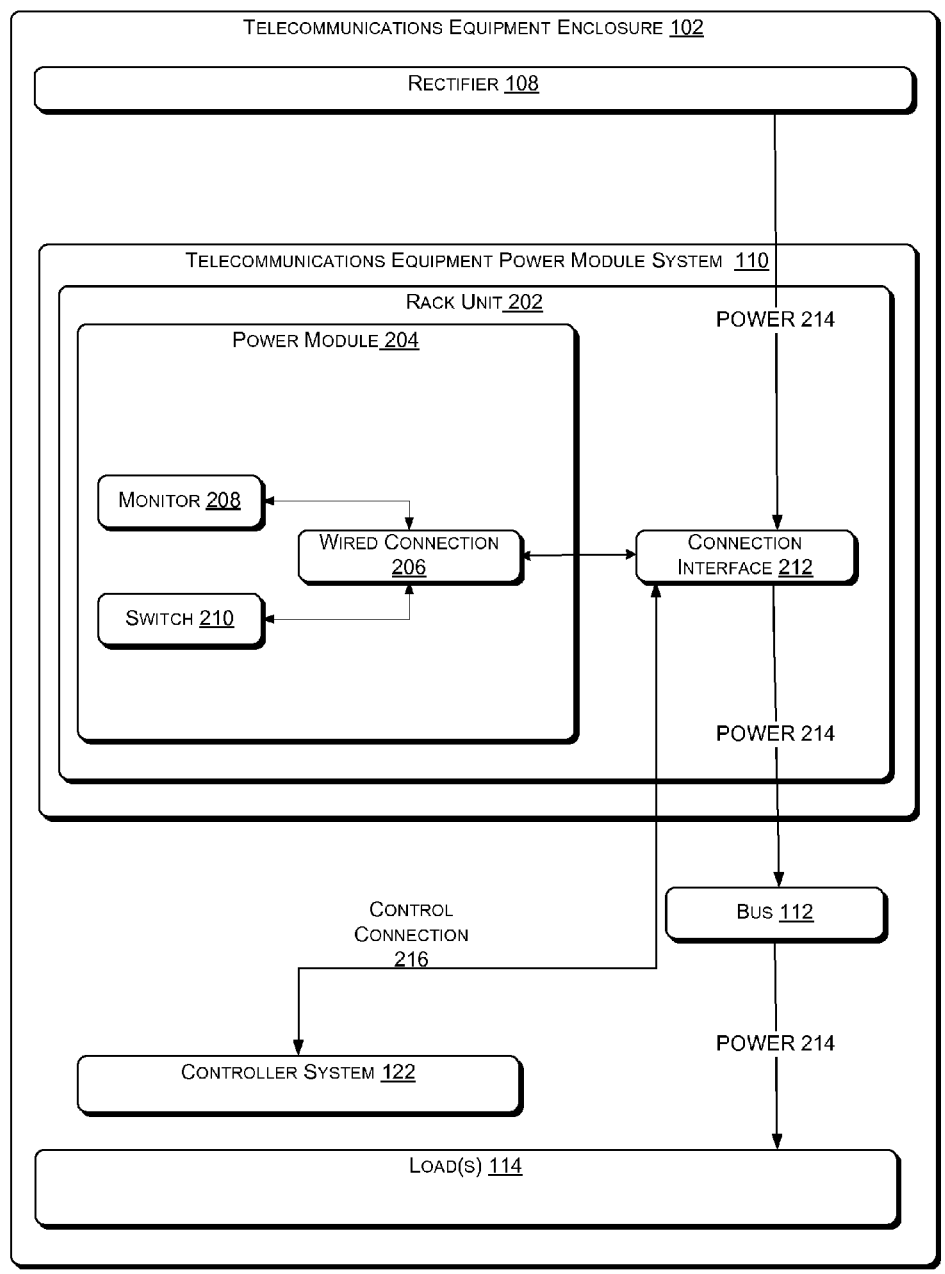
FIG. 2 is a signal flow diagram illustrating contents of an exemplary power module system.

FIG. 2 is a signal flow diagram illustrating, in greater detail, the contents of the exemplary enclosure including an exemplary telecommunications equipment power module system 110. In this non-limiting example, telecommunications equipment enclosure 102 houses a rack (not shown). In this non-limiting example, rack in turn houses rack unit 202, controller system 122 and load 114. In other embodiments, controller system 122 and load 114 may be in another rack enclosed in enclosure 102 or even placed outside of the enclosure 102.

Rack unit 202 may be configured with a connection interface 212. In one embodiment, the connection interface is on a backplane of the rack unit 202. The connection interface is a prewired connection on rack unit 202 (further illustrated in FIG. 8). The connection interface 212 is configured to couple with various equipment in the enclosure on the backside of the rack unit, and also simultaneously configured to couple with a wired connection in on the backside of power module 204 upon docking with the power module's wired connection 206.

In one non-limiting example, the connection interface 212 is configured to couple with control system 122 and load 114 rectifier 108. In addition, bus 112 serves to connect the connection interface to load 114. In this illustration, external (off-site) AC power is transformed to DC power via rectifier 108 as DC power 214. DC power 214 is then routed to connection interface 212 and to the bus 112. When a modular enclosure containing a switch is docked with connection interface 212, a switch or fuse, housed within power module 204 may complete a circuit between a power source and load. This provides an agnostic circuit level control of each unit of telecommunications equipment.

The controller system 122 may additionally or alternatively be programmed to operate environmental systems, site access (security) systems, fire or water detection and/or prevention systems, ventilation systems, generators or any other device that can be operated via connecting/disconnecting the switch from a power input.

Connection interface 212 may also serve as an interface for data. In a similar manner to power, the connection interface may serve as a pre-wired interface point for controller system 122. FIG. 2 illustrates connection interface 212 coupled to controller system 122 via control connection 216. In addition, connection interface 212 may serve to connect the controller 122 to a monitor such as monitor 208 in the modular enclosure (or in other locations) via the pre-wired connection interface 212 and wired connection 206.

Monitor 208 may monitor the power consumption of a single unit of telecommunications equipment (load 114) or a plurality of telecommunications equipment units. This is accomplished when the power module 204 is docked to the connection interface 214 via the wired connection 206. This enables the controller system 122 to monitor and connect/disconnect power from the telecommunications equipment at the circuit level via bus bar 112. Monitor 208 may also receive information from sensors such as temperature sensors, network traffic monitors, battery power level sensors, weather sensors and/or other sensing devices via the pre-wired connection and send data to controller system 122 via data connection 216. In addition, sensors may be directly wired to controller system 122, and external sensors may be interfaced with controller system 122 via I/O interface board 326. I/O interface board 326 is pre-cabled to controller 122 so that external devices can be added to the system without complexity. According to the preferred embodiment of the present invention, I/O interface board 326 uses commonly used "RJ" style connectors so that external devices can communicate to controller 122 with either discrete analog and digital circuits, or via a communications protocol. The communications protocol can be proprietary or any common method, including but not limited to, RS-485, RS-232, SNMP, Ethernet, or the like. The result is that external devices can be managed and upgraded without having to rewire and configure the base system.

The controller system 122 may also be in wired or wireless communication with a network control center via a network interface to give specific control of the telecommunications equipment connected to the interface connection during such events as major storms, electrical load management, network management traffic management functions, etc.

Controller 122 may continuously or periodically update a remote operations center of enclosure 102's status such as power consumption, network traffic, environmental conditions, etc. The remote operations center may also give instructions to controller 122 such as when to connect/disconnect specific equipment. In one example, communication with the remote operations center may be via a network protocol, such as Transmission Control Protocol/Internet Protocol (TCP/IP). An ability to communicate via TCP/IP allows the use of network security, subnet mask and Media Access Control (MAC) addressing with browser security levels up to the Really Simple Syndication (RSS) based. Communication is via Simple Network Management Protocol (SNMP) traps, Short Message Service (SMS) via dial out modem (GSM), Universal Serial Bus (USB) for local access, and Ethernet TCP/IP network.

Thus, the controller system 122's agnostic ability to connect/disconnect equipment and the ability to monitor equipment at the circuit level provides dynamic power distribution capability regardless of the brand or model of equipment used. Additionally, the controller is able to identify which units of telecommunications equipment (e.g., which radios or environmental systems) are drawing power on each circuit.

Rack unit 202 may house power module 204 in a modular manner. A variety of rails, fasteners and other means are available to easily secure and unsecure the power module with the rack unit. In addition, the pre-wired data/power connection via wired connection 206 and connection interface 212 provides a quick and efficient structure to allow connection/disconnection of data and power to each power module.

As discussed above, the interface connection 212 serves as an interface for a variety of power and data equipment which provides a plug and play swap capability. The connection interface 212 makes re-wiring unnecessary when a new power module is docked to the connection interface.

Power module 204 is a swappable modular unit that docks within rack unit 202. When docked within the rack unit, the wired connection on the power module selectively couples with the connection interface 212 in the rack unit 202. Power and data connections between the rack unit via the connection interface 212 and the power module may be via a wired connection 206.

The power module is thus easily replaceable with other modular enclosures housing a variety of different components. A user need only dock a different power module into the connection interface.

In one embodiment, power module 204 may enclose a switch 210 and monitor 208 coupled to wired connection 206. Upon docking with the connection interface in the rack unit via the wired connection, a power and/or data circuit may be formed when the switch 210 is activated.

In addition, controller system 122 may be used to control actuation and connection/reconnection of the switch. The controller system 122 may be in communication with both the switch 210 and monitor 208 via the connection interface 212 and wired connection 206.

The power module may house a variety of components. This permits circuit level application specific modularity without connecting/disconnecting the loads connected to the rack unit via the connection interface 212. For instance, the power module may include components to enable DC power protection, remote actuated breaker control, circuit power measuring, low voltage battery disconnect functionally, low and high power alarms and other functionality.

In other embodiments, a power module may house three switches which provide three separate circuits for three different telecommunications equipment units. In other embodiments, the modular enclosure may house a plurality of monitors to monitor temperature and/or a specific circuit current a unit of telecommunications equipment is consuming.

Some illustrative examples of power module configurations include:
- 2-position single-pole circuit breaker—up to 100 amp total maximum output—no shunt.
- 2-position single-pole circuit breaker—up to 100 amp total maximum output—with shunt.
- 2-position single-pole circuit breaker, contactor fed—up to 100 amp total maximum output—no shunt.
  - Up to 2 battery strings, low-voltage disconnect module, up to 100 amps maximum—2 each 100 amp circuit breakers.
- Remote operated load isolation/disconnect, 2-position single-pole circuit breaker, contactor fed—up to 100 amp total maximum output—with shunt.
- 10-position GMT fuse module, 15 amps per position, with load and return terminal on module front.

Yet other embodiments may include various other components within the power module to provide a variety of application specific modular enclosures including enclosures for:
- Basic single circuit distribution, load circuit breaker or TPC or TLS/TPS fuse block.
- Basic single circuit distribution with current monitoring and load circuit breaker or TPC or TLS/TPS fuse block.
- Basic dual circuit distribution, load circuit breakers or TPC or TLS/TPS fuse block.
- Basic dual circuit distribution with current monitoring and load circuit breakers or TPC or TLS/TPS fuse block.
- Dual circuit distribution with current monitoring circuit breakers or TPC or TLS/TPS fuse block and disconnect.
- Battery disconnect, 2 strings, 100 amps per, with circuit breakers or TPC or TLS/TPS fuse block.
- Battery disconnect, 2 strings, 100 amps per, with circuit breakers or TPC or TLS/TPS fuse block and electrical disconnect.
- Battery disconnect, 1 strings, 200 amps per, with circuit breakers or TPC or TLS/TPS fuse block.
- Battery disconnect, 1 strings, 200 amps per, with circuit breakers or TPC or TLS/TPS fuse block and electrical disconnect.
- Basic module with 10 position GMT fuse block and termination strip
- Load Isolation module with dual 100 amp disconnects, dual shunts.

Figure 3:
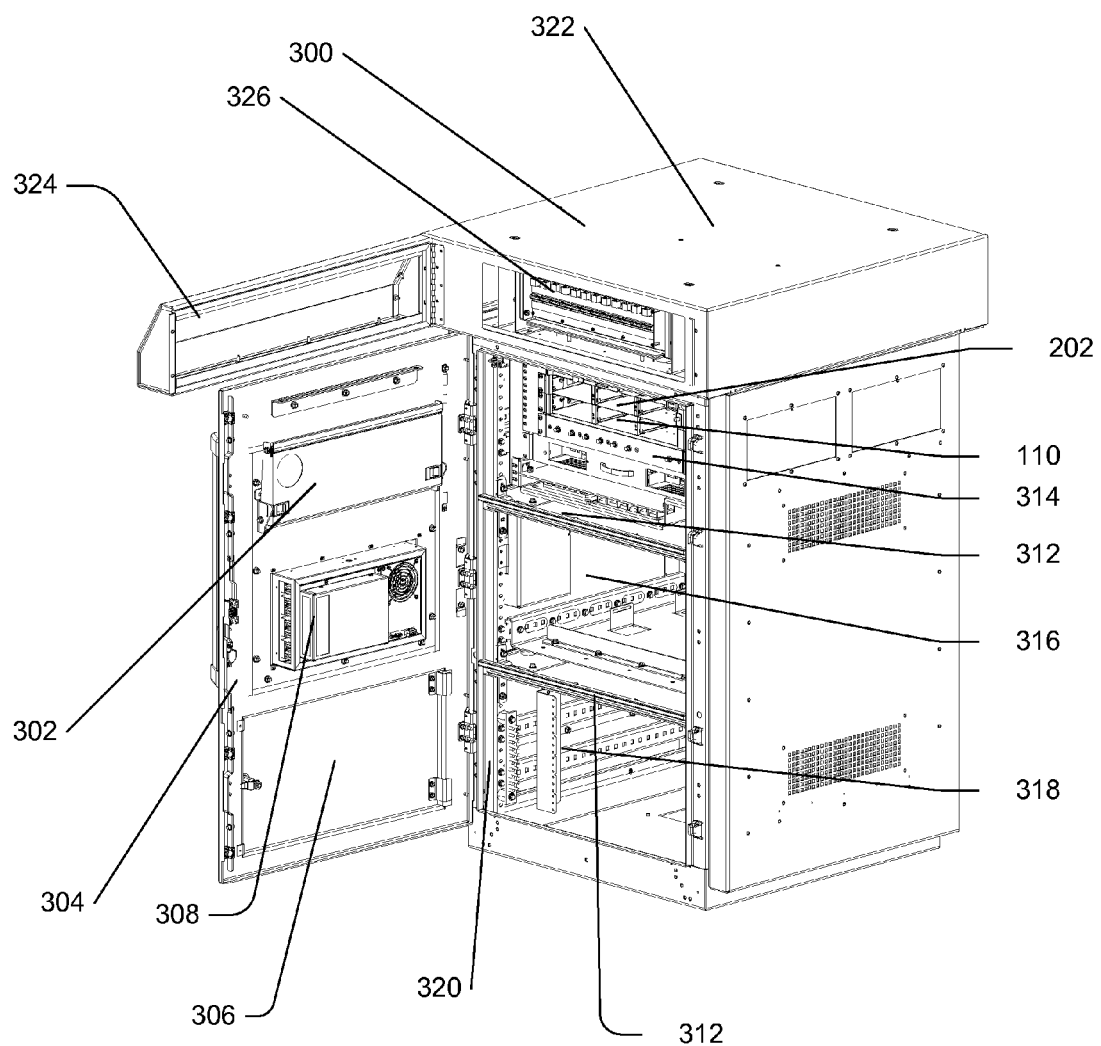
FIG. 3 is a perspective view of an exemplary telecommunications equipment enclosure.

FIG. 3 illustrates an illustrative enclosure 300 with a power module system 110 according to one exemplary implementation. The enclosure 300 comprises a plurality of panels which enclose a rack 202. The enclosure 300 may also comprise a frame or other structural support. Here, the enclosure 300 features at least one panel configured to serve as a door 304. Door 304 serves to provide access to the equipment inside the enclosure. Attached to the door is a laptop tray 302.

The non-limiting illustration of FIG. 3 also includes a sub-panel 306 on door 304. Sub-panel 306 may be used to limit access to a smaller area of the interior as opposed to the area accessible via door 304. Door 304 may also comprise a panel mounted device 308. The panel mounted device may be, but is not limited to, environmental systems such as an auxiliary air cooling system or direct air cooling, air conditioner units, and/or heat exchangers, as well as alarms, monitoring systems and/or batteries. Environmental systems attached to the enclosure can be closed or open systems.

When closed, door 304 covers an opening of the enclosure. Weather stripping or other sealing material may extend substantially around the opening so that when the door 304 is closed, the enclosure provides a substantially weather-tight enclosure that protects the contents of the enclosure from the weather. Thus, the enclosure of FIG. 1 is suitable for use as an outdoor enclosure. Sub-panel 306 and lid 322 may have similar features. The door and sub-panel may be either doors, hatches or other suitable means of entry. Different locks may be on the provided on the access panel, on the sub-panel and the lid to restrict access to the different areas with the aid of dividers (discussed below).

In another embodiment, removable lid 322 may also feature a door 324 covering an input/output (I/O) board 326. The lid may also be removed altogether to allow 360 degree access to the contents in the top section of the enclosure 300.

Enclosure 300 may also be divided into several areas. The first area 314 and second area 316 are created by divider 310. A third area 318 is created by divider 312. The dividers may be used to create multiple environmentally distinct areas to suite specific needs of equipment stored in different areas via restriction of airflow between the different areas. The restriction may be absolute or may be substantially airtight. Although the dividers in FIG. 3 are shown creating near equal sizes of chambers, the dividers may be mounted in any location within the enclosure to create suitable spaces for the equipment mounted within. In other examples, the areas may be in communication with each other and may include fans or cooling equipment to control airflow and temperature between the areas.

In one embodiment, one area may have direct air cooling and another area may be a sealed closed-loop air conditioned environment. This is accomplished by allocating a dedicated panel-mounted device 308 to a specific area such as in FIG. 3. In this embodiment, the first and third areas are isolated from the second area via the dividers to suit the environmental needs of equipment housed within each area. Here, the second area is serviced by a panel mounted device 308 (e.g. an Heating, Ventilating and Air Conditioning (HVAC) device) while the other areas are not. However, in other embodiments, a panel mounted device 308 may influence the environment of both areas 314 and 318 (discussed below).

In one embodiment, an environmentally separate area, which houses the batteries, is kept at approximately 70 degrees Celsius by the panel mounted device 108. The another environmentally separate area housing a rectifier, controller system and various switches and breakers in various modular enclosures may be kept at approximately 50 degrees Celsius by a direct air heat exchanger, a closed loop heat exchanger, a compression cycle refrigeration system, direct air cooling system, and/or a thermal electric cooler (now shown). In this embodiment, the divider may be made of insulating material to prevent cooling/heating effects affecting separated areas of the enclosure.

In another embodiment, multiple panel-mounted devices are allocated to a first area, while other panel-mounted devices are allocated to second area, while yet another panel-mounted device is shared by the two areas. These may include an environmental monitoring system, an alarm, an air conditioner or the like. This is accomplished with connections that connect the two areas together such an air duct, data cable, etc.

As discussed above, upon creation of multiple areas inside the enclosure, a sub-panel mounted on the door 304, may restrict access to an area to unauthorized users while permitting full access to the enclosure contents to authorized users.

For example, in FIG. 3, access to area 318 may be given to authorized users while access to areas 314 and 316 may be restricted from said users. Thus, users with authorization to access each of the three areas of the enclosure are given access to door 304. Users with access to area 318 may only open sub-panel 306. This is accomplished by configuring the door and sub-panels with different locks.

Another security feature that may be implemented is monitoring activity inside the enclosure 300. Monitors may monitor activity inside the enclosure for certain trip events. For example, if a circuit breaker is tripped a pre-determined number of times, certain equipment within the enclosure may be locally or remotely disabled. In addition, upon detection of a trip event, the equipment inside the enclosure may notify a remote control center of the event via wired or wireless connections. The remote control center may then reactivate the equipment if desired via controller system 112 and the power module system 110. In one embodiment, a user with limited access to only the equipment accessible via sub-panel 106 is subject to equipment shut down. For instance, the equipment shut down if the user trips a circuit breaker a predetermined number of times. The shut down may also be subject to a time limit (e.g., equipment reactivates in ten minutes).

In FIG. 3, enclosure 300 is illustrated as enclosing a power module system 110. The power module system 110 in this non-limiting example comprises a power module 204 and a rack unit 202. Rack unit 202 may be mounted in rack 320 which may house the power module system, rectifiers, controller system and/or other telecommunications equipment. A variety of rails, walls and fasteners can be used to secure the power module within the rack unit and the rack unit within the rack.

As illustrated in FIG. 3, rack 320 is used to house rack unit 202. Rack unit 202 features a connection interface (further discussed below). The connection interface may be used as a telecommunications equipment/controller system and may include a pre-wired interface. More specifically, the connection interface serves to eliminate the need for re-wiring/re-connecting telecommunications equipment when a modular enclosure is changed. In other words, the telecommunications equipment and other desired devices remain connected to the connection interface, while a plurality of power modules are interchangeably docked with the connection interface via a wired connection on the power modules.

Docking between the connection interface and the power module presents the capability of "plug and play" installation of any desired power module. In one embodiment, power modules house switches. The ability to modularity install and interchange the modules, eliminates the necessity of hard coding such equipment as breakers and fuses into an enclosure.

The Power Module System

Figure 4:
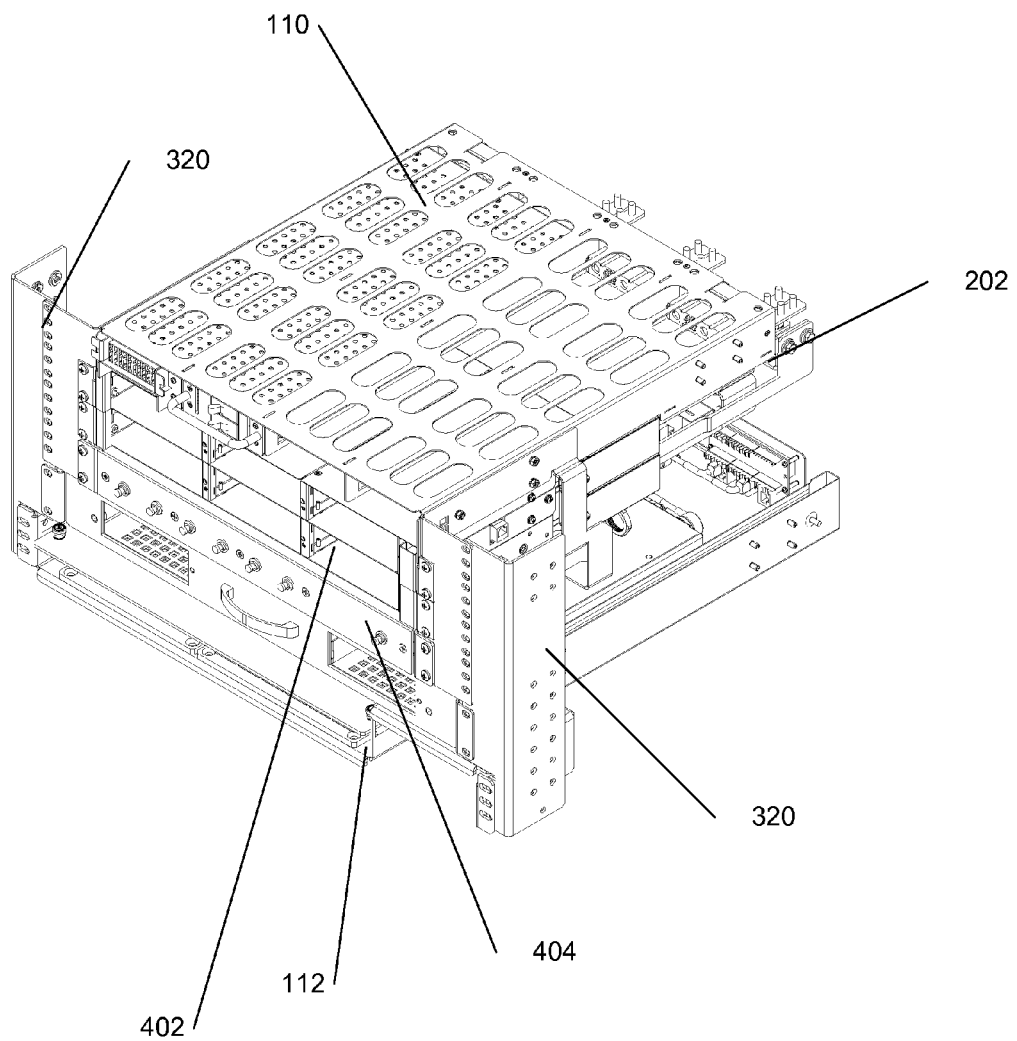
FIG. 4 is a perspective view of a rack including an exemplary power module system, an AC distribution system, a bus bar and rectifier drawer.
Figure 6:
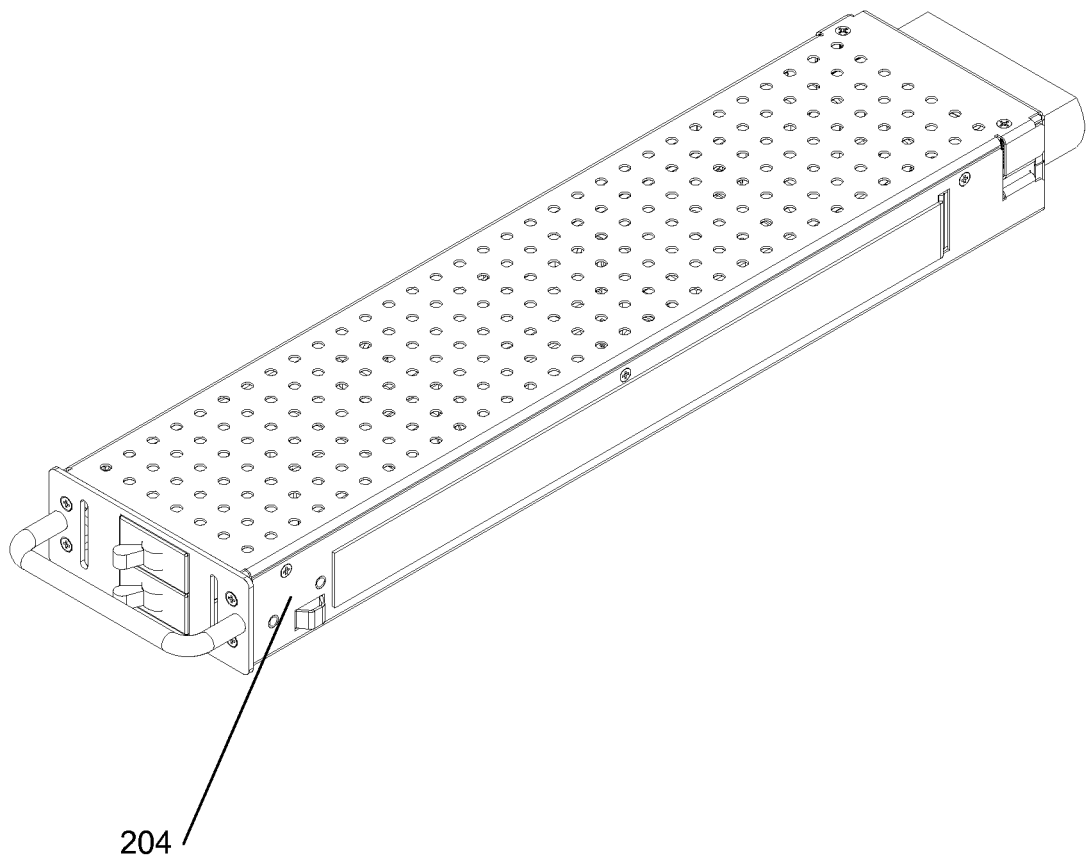
FIG. 6 is a perspective view of an exemplary power module usable with the power module system of FIGS. 1-4.

FIG. 3 illustrates a power module system 110 in an enclosure. In addition, FIG. 4 illustrates a close-up view of the power module system 110 and portions of rack 320. In this non-limiting example, rack unit 202 has dimensions of one rack unit (1 U), however other dimensions are also possible. The rack serves to house a power module 204 (see also FIG. 6) within one unit of the rack. Thus, a total of four power units may be stored in the illustrated version of rack unit 202. The other units of the rack serve to house a plurality of modular enclosures. In this example, a unit is approximately 1.75 inches in height and approximately 19 inches in depth. Various ranges are also contemplated. In one embodiment, a range of +/-five inches is embodied. In one embodiment, a 19 inch wide rack may accommodate approximately four module slots for four modular enclosures. In another embodiment, a 23 inch wide rack may be used. This may accommodate approximately five module slots for five modular enclosures. Other rack and enclosure dimensions may also be used.

Figure 5:
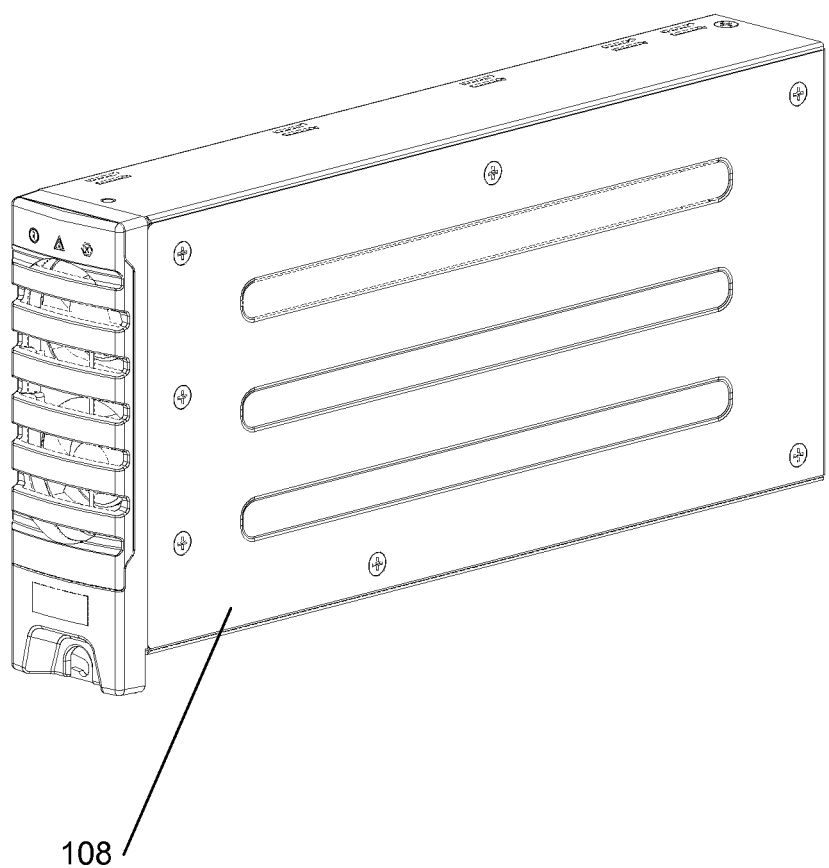
FIG. 5 is a perspective view of an exemplary rectifier usable with the power module system of FIGS. 1-4.

FIG. 4 also illustrates bus bar 140, a rectifier drawer 402 and an AC distribution system 404. In a manner similar to the power module system, the rectifier drawer and controller system can offer similar plug-and-play functionality to allow swapping of rectifiers and/or controllers via a pre-wired connection. Rectifier modules (see FIG. 5) are commercially available in different voltages, current capacities, and efficiencies. In one embodiment, it is possible to run different voltages in different drawers for applications that require multiple DC voltages to be supplied (e.g., 12 volt and 24 volt systems).

Figure 7:
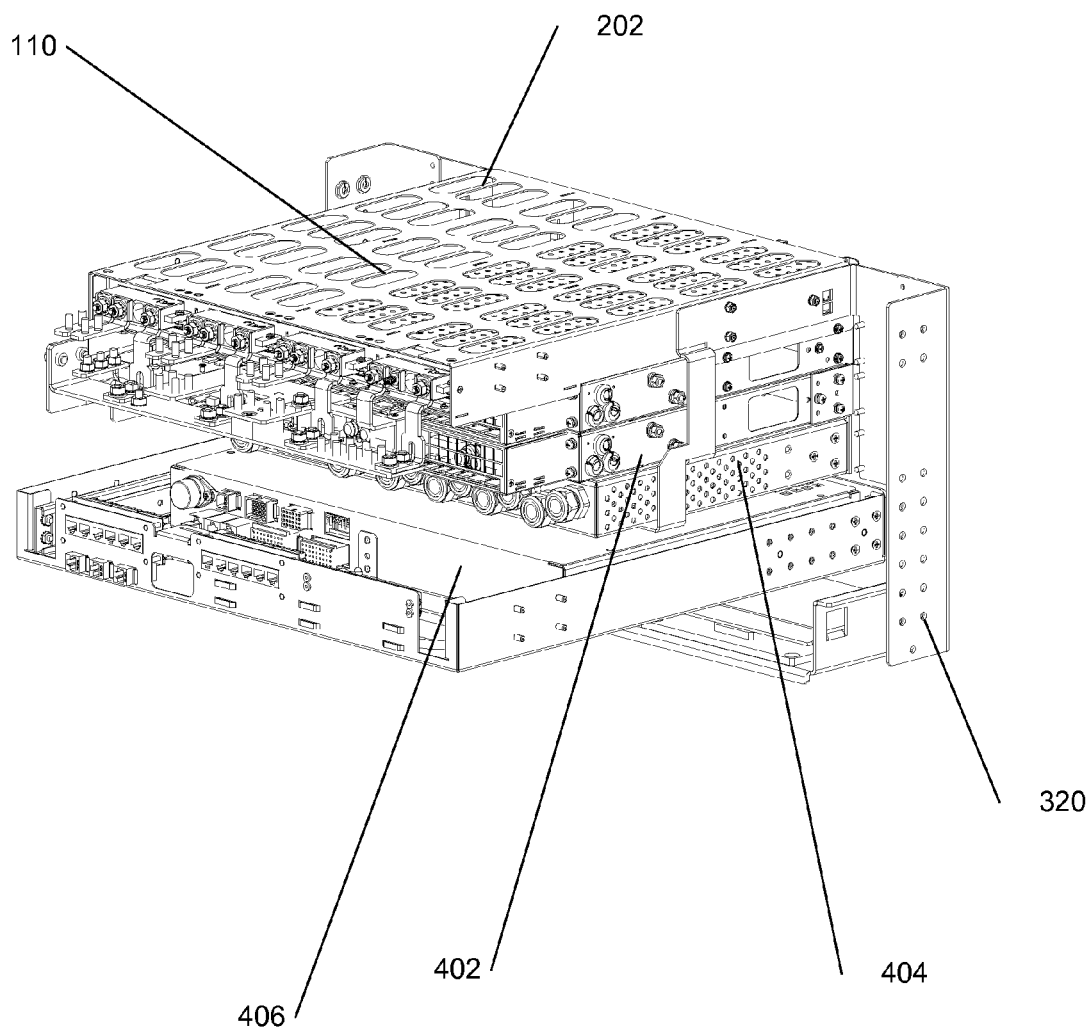
FIG. 7 is a perspective view of a rack including an exemplary power module system, an AC distribution system, a bus bar and rectifier drawer.

FIG. 7 shows the back side of rectifier drawer 402, power module system 110, AC distribution system 404 and controller drawer 406. In this embodiment, the rectifier shelf 402, power module system 110 and controller drawer 406 feature the modular capability. Specifically, the rectifier drawer, the rack unit of the power module system and the controller drawer each feature a connection interface. As discussed previously, the pre-wired connection interface connects the rectifier drawer to the AC distribution 106, the rectifier shelf to the rectifiers 108 and the controller drawer to cooling units 120, rectifiers 108 and the power module system 110. The pre-wired connection interface also connects the rectifier drawer, the rack unit of the power module system and the controller drawer to a rectifier module, a power module and a controller module/board, respectively. Also discussed above, these pre-wired connections may be made in the same manner that wired connections 206 and connection interface 212 were illustrated in FIG. 2.

Figure 8:
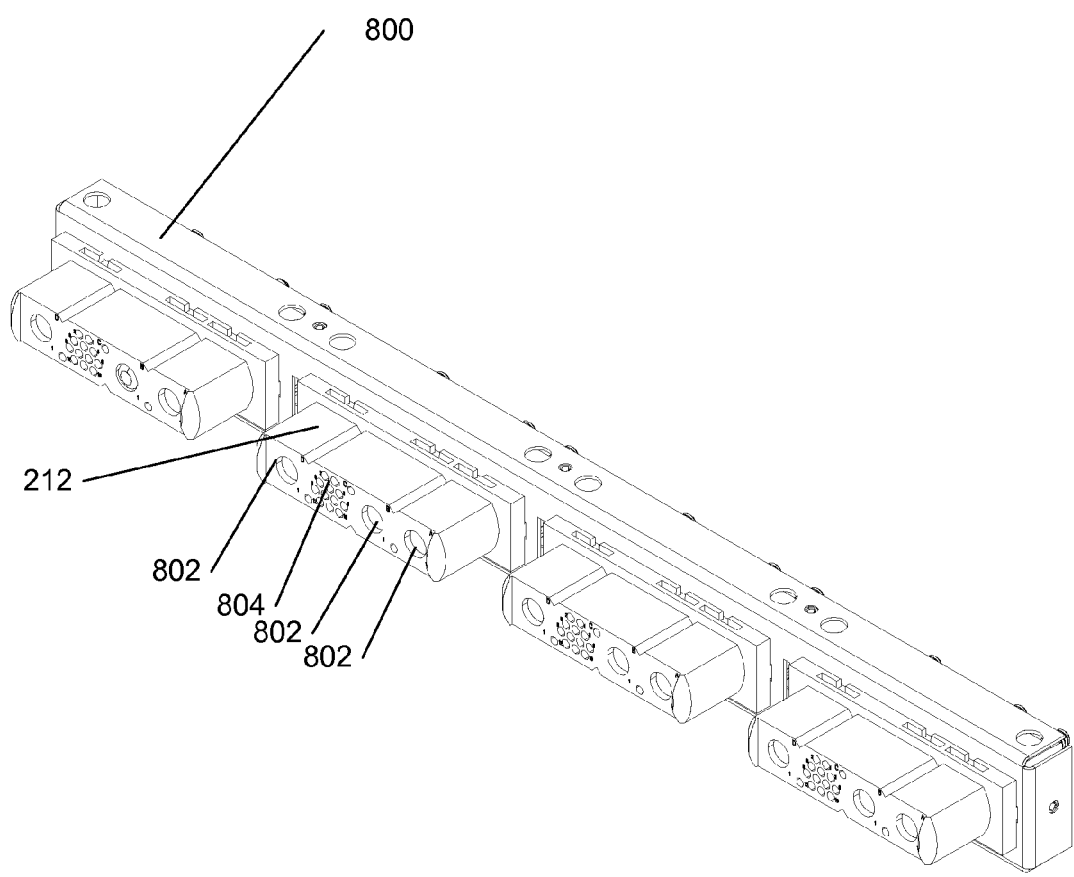
FIG. 8 is a perspective view of a portion of a back side of a backplate of a rack unit illustrating an exemplary connection interface.

FIG. 8 in particular illustrates a portion of the back side of a backplane 800 of rack unit 202. The illustrated power/data connectors of the connection interface 212 are configured to engage into a corresponding wired connection 206 of a power module 204 in a modular fashion. This allows convenient interchangeability of various power modules 204 into and out of rack unit 202. In this embodiment of connection interface 206, data connectors 804 and power connectors 802 provide a module interface for data and power to wired connection 206, which would feature corresponding connectors to mate with data connectors 804 and power connectors 802. The power connection is made via power pins 802, wherein two or three of the pins can be used. For breaker type modules, two of the pins are used, For GMT style modules, wherein loads may be directly coupled to module 204, the third pin is used for the common side of the circuit. Signal pins 804 provide control and data signals between controller 122 and power module 204. The combination of power and signal pins within a single connector provides improved usability and reliability over using multiple connectors.

Figure 9:
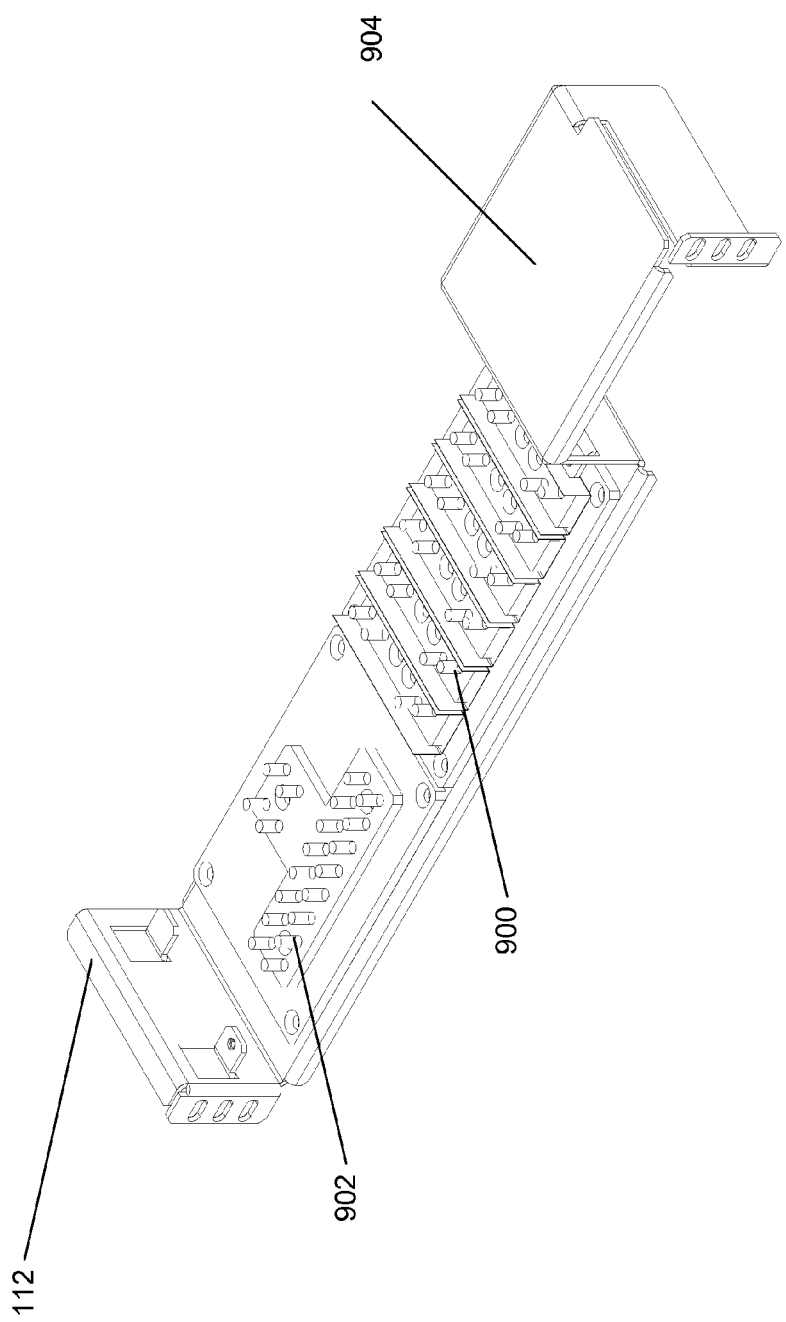
FIG. 9 is a perspective view of an exemplary bus bar usable with the power module system of FIGS. 1-4.

FIG. 9 illustrates the bus bar system as discussed above in more detail. The power module system 110 may be connected to the bus bar 112. Bus bar 112 serves to centrally isolate a circuit comprising a rectifier and a load 114 (e.g., cellular radio or other telecommunications equipment) via a load bar. Thus, bus bar 112 serves as a circuit isolation mechanism to prevent electrical interference between rectifier/load circuits. In one embodiment, power module system 110 is connected to load bars 900. Each load bar 900 may be reserved for a single power module. Each power module load bar 900 is connected to a common bar 902. Common bar 902 is connected to a rectifier reserved for a single power module. Then common bar 902 and load bar 900 may be connected to complete a circuit. Thus, an isolated circuit is produced for each rectifier/power module combination. Bus bar 112 may be connected to rack 320 via bus bracket 904.

In one embodiment of the use of a bus with a power module, at least one power input bus, a plurality of power output buses and at least one slot for a power module may be configured with a power module to form part of a circuit. Specifically, the slot may be configured with a slot power and signal connector configured to engage a power module. The power module may be in turn configured to engage with the slot and electrically couple the input bus to an output bus via another power and signal connector.

Power Modules

Figure 10:
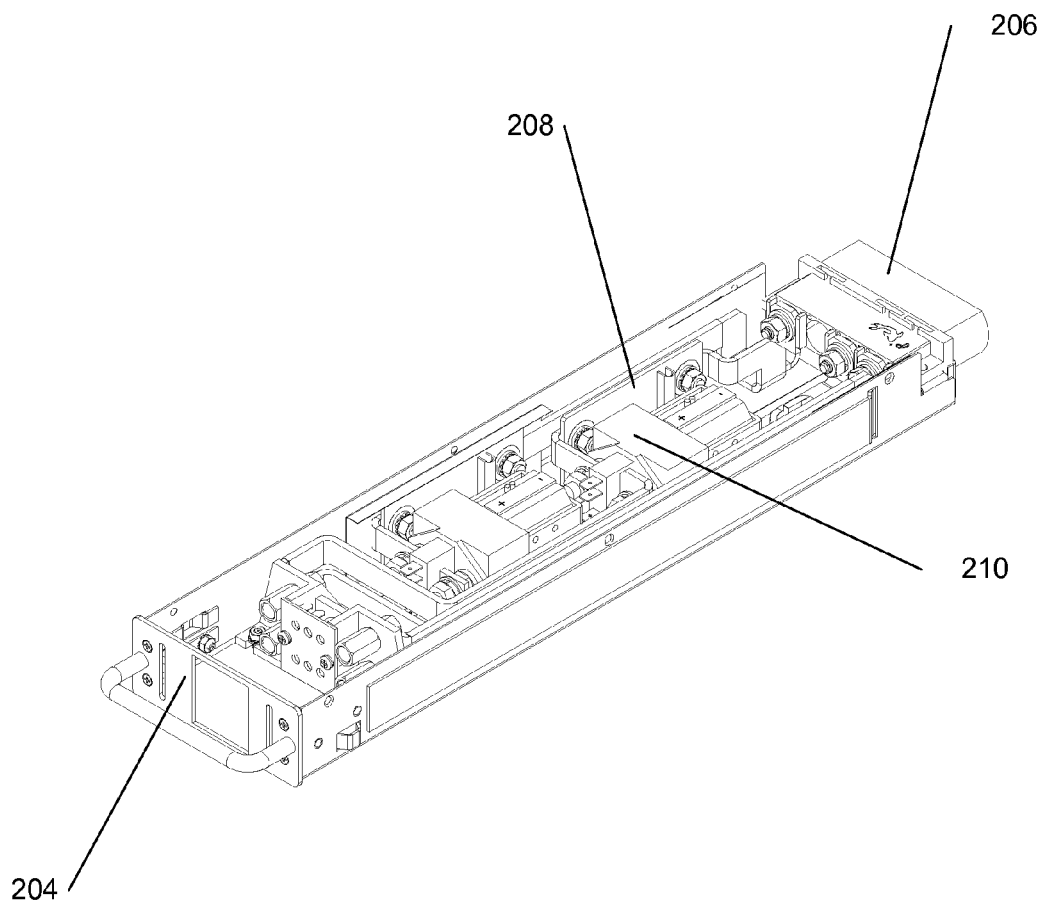
FIG. 10 is a perspective view illustrating the contents of an exemplary power module.

FIG. 2 and FIG. 10 are illustrative of a signal/power flow embodiment illustrating, in greater detail, the contents of the exemplary enclosure 300 and power module system 110. As discussed above, rectifier 108 may receive AC power from an off-site utility power source 126. This AC power is converted by rectifier 108 into DC power 214 and routed to a power module 204 via bus 112. In one instance, power module 204 serves to distribute DC power to the appropriate load 114.

Power module 204 may contain a monitor 208 and a switch 210. In some embodiments, power module 204 may also contain a controller among other components. Alternatively, power module 204 maybe connected to a controller external to the power module such as controller system 122. Power module 204 may also have mixed distribution types (programmable and non-programmable fixed function distribution types) as a hardware cost savings measure. In addition, the power module 204 may be constructed in a modular form. This would allow a single chassis to accommodate a plurality of power modules. This results in a cost savings from ease of installation and repair.

In FIG. 2 and FIG. 10, power 214 maybe first routed from the rectifier 110 to monitor 208 via connection interface 212 and wired connection 206. Monitor 208 may be a shunt or similar mechanism to monitor the power that load 114 consumes. Specifically, monitor 208 serves to monitor specific circuit currents of telecommunications equipment (load 114) to controller system 114. In other embodiments, monitor 208 may be outside of power module 204. For example, monitor 208 may be a part of a telecommunications equipment unit or a part of controller system 122. Monitor 208 may monitor the power consumption of a single unit of telecommunications equipment or a plurality of units.

After power 214 is routed through monitor 208, power 214 is then routed to switch 210. The switch 210 may be any sort connection mechanism. In one embodiment, switch 210 is an electrically operated power disconnect that allows connection/disconnection of the power output of the power module 204 to load 114. A circuit breaker, a relay, a contactor, or digital FET, are examples of switches.

In one embodiment, controller system 122 instructs switch 210 to connect power 214 to load 114. Typically controller system 122 is located within or on enclosure 300. For instance, controller system 122, which may comprise a single or multiple controllers, may be located within the power module 204, outside of module 204 or even attached to the exterior of enclosure 300.

Controller system 122 may receive power consumption information from monitor 208. As discussed above, monitor 208 may monitor the power consumption of a single unit of telecommunications equipment or a plurality of units. Controller system 122 may also receive information from sensors such as temperature sensors, network traffic monitors, battery power level sensors, weather sensors and other sensing devices.

Controller system 122 may also be connected to switch 210 via connection interface 212 and wired connection 206. Thus, controller system 122 is able to control the power distributed to each unit of telecommunications equipment. Connection/disconnection of power from the load 114 may be controlled via switch 210 (e.g., by closing or opening the circuit).

In addition, controller system 122 may be programmable to control the connection/disconnection of power 214 to load 114 based on a variety of trip events. Such trip events may comprise: DC voltage level, AC power loss, a predetermined temperature, system current (amp) levels (AC OR DC), battery voltage level, major weather storms, electrical load management, network traffic management functions, low voltage control, preset time delays or a combination of these events.

Trip events may be detected by monitor 208 and transmitted to controller system 122. The trip event is transmitted via wired connection 206 and connection interface 212. These connections and any other connection in or to the enclosure may be a wired or wireless connection. Trip events such as preset time may be programmed into local controller system 122 on-site or transmitted via a network from a remote control center. Once controller system 122 receives the trip event, controller system 122 in communication with power module 204, may connect/disconnect load 114 via switch 210.

Connecting/disconnecting load via power module 204 has many advantages over traditional power management methods. Traditional power management methods have used connections from an I/O board of the controller to directly interface to the unit of telecommunications equipment. This interface method is complicated and expensive. Specifically, specialized and some times proprietary protocols and hardware (such as controller board designs) previously had to be used to interface the controller to each different piece of telecommunications equipment.

However, connecting controller system 122 to power module 204 to control connection/disconnection of the telecommunications equipment creates a protocol agnostic interface. In other words, power distribution is controlled by simply connecting/disconnecting power to each telecommunication equipment unit at the circuit level. This enables controller system 122 to control a plurality of telecommunications equipment with a single type of interface to the power module 204 as opposed to having a separate interface protocol for each separate telecommunications equipment unit.

The controller may additionally or alternatively be programmed to operate environmental systems, site access (security) systems, fire or water detection and/or prevention systems, ventilation systems, control of generators or any other device that can be operated via connecting/disconnecting the switch from a power input.

Thus, controller system's protocol agnostic ability to connect/disconnect equipment and the ability to monitor equipment at the circuit level provides dynamic power distribution capability regardless of the brand or model of equipment used. Additionally, controller system 122 is able to identify which units of telecommunications equipment (e.g., which radios) are drawing power on each circuit.

Exemplary Uses of Circuit Level Control

As discussed above, there are a variety of situations at cellular sites that power module system 110 can be configured to address. One such situation is to conserve power during "green operations." For example, monitor 208's ability to monitor telecommunications equipment loads at the circuit level enables controller system 122 to optimize power consumption. Specifically, controller system 122 has the capability to decide which specific unit to shut-down according to a variety of situations.

In one situation, the piece of telecommunications equipment being used is a Global System for Mobile Communications (GSM) radio. The amount of traffic that the GSM radio is carrying is proportional to the power it consumes. At non-peak hours, monitor 208 communicates to controller system 122 that the power consumption has reduced significantly (due to lower traffic via the GSM radio). Controller system 122 may instruct switch 210 to disconnect power 214 to one or more of the GSM radios. In addition, controller system 122 may divert any traffic the GSM radio was transmitting/receiving to another radio to provide uninterrupted service.

Additionally or alternatively, power modules 204 and controller system 122 may be able to optimize power consumption via a load-based rectifier shutdown. A monitor may be used to monitor a rectifier's load and communicate this to controller system 122. Controller system 122 may then connect/disconnect any appropriate telecommunications equipment based on rectifier load.

In another instance, power consumption may be optimized by enforcing programmed circuit loads. Specifically, the circuit serving load 114 may be monitored by monitor 208. When a load on that particular circuit reaches a desired load, controller system 122 may take appropriate action. One action may be to decrease the internal temperature of enclosure 300 (or a specific area in enclosure 300) by activating an air conditioner, to notify the remote operations center, etc.

In yet another situation, a remote operations center may instruct controller system 122, via a network, to connect/disconnect certain units of telecommunications equipment to accommodate any requirements such as to conform to a desired total utility load, adjust costs according to power prices during certain times of the day, etc. For instance, during peak times of usage the price for power is usually higher than at non-peak times. The remote operations center may continually monitor power rates set by power companies and instruct controller system 122 to disconnect nonessential units of telecommunications equipment in order to minimize power costs.

Power failure is yet another situation, the power modules and controller system 122 can be configured to address. During a power failure, the controller system 122 allows remote cellular sites to operate for extended periods without input or control by a remote operations center. Previously, upon detection of a power failure, an on-site generator would automatically turn on. However, the generator would run continuously until it expended its fuel. Then, the site relied on the remaining power stored in its batteries. Once the batteries ran out, the site went down.

In contrast, the circuit level control discussed above may provide dynamic backup power management, which results in more efficient use of resources. Specifically, dynamic management on a circuit level results in a longer service time during a power failure than with previous management systems. First, upon detection of an off-site power failure, the site initially runs off of battery backup power, and controller system 122 begins monitoring the on-site battery levels. Controller system 122 may also disconnect, via a switch, lower priority telecommunications equipment units. This disconnection of lower priority equipment units may be performed according to one or more power conservation profiles stored in memory, and may be performed as-needed (e.g., different equipment units may be turned off at different times and/or battery levels). Controller system 122 may also consolidate functions to certain essential units of telecommunications equipment in order to disconnect other non-essential pieces of telecommunications equipment (e.g., consolidate traffic on one radio rather than multiple radios).

Controller system 122 may identify when the batteries drop below a certain level and require recharging. The battery power level may be monitored by a battery monitor in communication with controller system 122. In this instance, the controller system 122 may activate an on-site generator to provide power to the telecommunications equipment units and to recharge the batteries. Once the batteries are recharged, controller system 122 may instruct the switch 210 to disconnect the generator to shut-down and conserve fuel. The telecommunications equipment units will then transition back to running on battery power. This cycle may continue until the generator expends its fuel or AC power is restored. In addition controller system 122 may be configured to shut the site down or take other action if the battery charge runs below a threshold. This prevents battery damage.

Thus, dynamic circuit level management of the limited on-site resources (battery power and generator fuel) will enable the site to provide longer service than traditional on-site back-up systems. This is provided by the controller system's dynamic ability to monitor specific telecommunications equipment at the circuit level and then to connect and disconnect specific units to dynamically manage power. This results in minimum exhaust emission from the generator and a reduction in maintenance need at the cellular site.

In addition, controller system 122 provides local control that was traditionally not available during a power failure. Specifically, during a power failure, remote control via a remote operations center may be unavailable due to a downed communication line or other infrastructure failure. Controller system 122 therefore provides on-site control that is independent of off-site communication/power failures.

In the instance that local controller has communication with the remote operations center during a power failure, the controller system 122 may also serve many purposes. It may allow specific commands from the remote operations center to be carried out remotely. The controller system 122 may also serve to update the remote operations center on battery and generator fuel levels during the power outage. The remote operations center may then divert maintenance crews to the sites that require maintenance/fuel first.

Modular Control System

Figure 11:
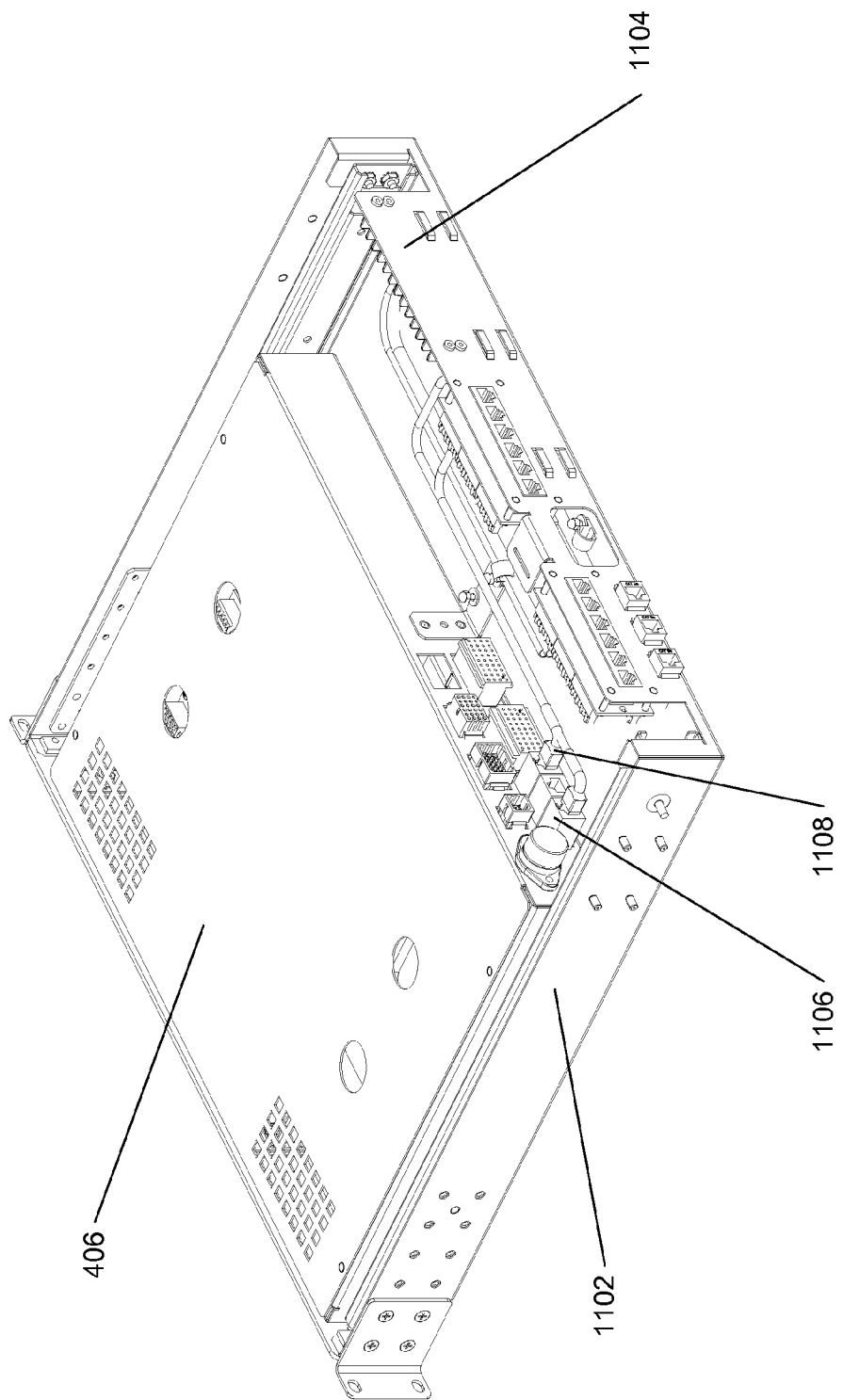
FIG. 11 is a perspective view illustrating an exemplary embodiment of a control system.

FIG. 11 illustrates an exemplary embodiment of a control system 122. In this particular embodiment, control system is comprised of a modular controller drawer 406, a controller rack 1102. The modular docking of the controller drawer and controller rack is similar to the power module and rack unit docking discussed above. As illustrated, control system 112 provides a convenient way of removing/installing a controller drawer in an enclosure. Controller rack 1102 may be mounted in a rack 320. Upon initial installation, controller rack 1102 typically has data and other connectors connected to the controller backplane 1104 connections via the controller connection interface 1106. Controller drawer 1101 may then be installed. The controller drawer connects with the controller connection interface 1106 via controller wired connection 1108. Thus, controller drawers may be exchanged without disconnecting equipment from controller rack 1102. The controller drawer may contain one or a plurality of controller boards/controllers. Typically, each controller in the drawer has a corresponding controller wired connection 1108 in the controller drawer 1101 which itself has a corresponding controller connection interface 1106.

As discussed above a controller may provide network connectivity for such purposes as providing a webased interface. In addition, the controller may provide a Liquid Crystal Display (LCD) interface to a user of the enclosure. The controller system 112 can be assigned an IP address, either static or dynamically assigned, so it can be polled or used remotely.

Controllers may record analog values, digital values, and in turn, return the same. Thus, any combination of sensors can be made to output the desired response. In another embodiment, rather than analog and digital inputs and outputs, control system 122 can be made to communicate to other cell devices using standard communication protocols. This method allows advanced communications between intelligent devices as needed.

Multiple Area Cooling/Heating

As discussed above, separating areas of the enclosure 300 via dividers 310 provides not only advantages to the security of telecommunications equipment inside an area(s), but also allows environmental systems directly connected to a first divided area of the enclosure to heat/cool another area of the enclosure not directly connected to the environmental system. In other words, areas associated to a first area may be used to help cool or heat other areas of the enclosure.

Figure 12:
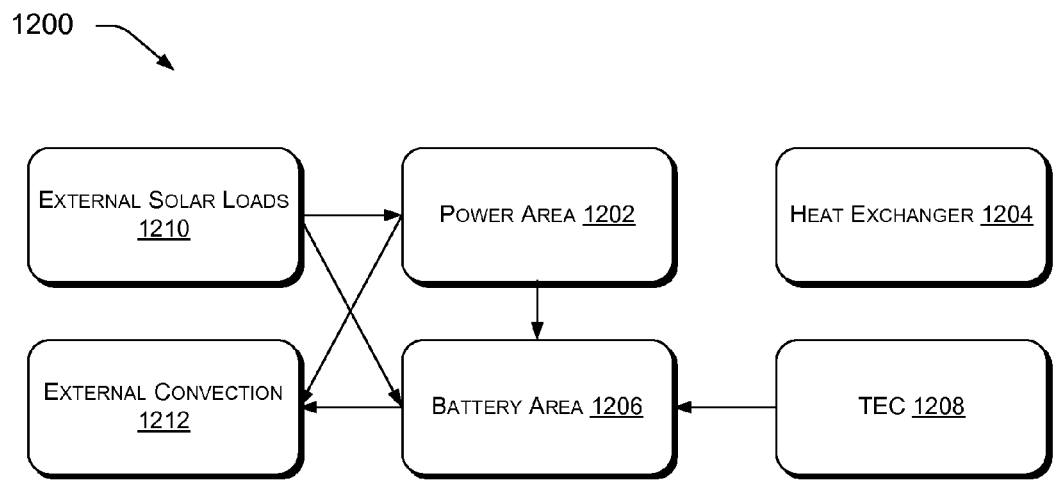
FIG. 12 is a flow chart of an exemplary method of heat distribution within an enclosure in on a cold day.

For instance as illustrated in FIG. 12, an enclosure may be divided by a divider which provides an airtight seal. The cooling/heating systems directly connected to these areas may influence the temperature in areas not directly associated to the heating/cooling systems. In this example, this influence is demonstrated by a cold day interaction 1200. The power area 1202 and battery area 1206 are associated to a passive heat exchanger 1204 and a Thermal Electric Cooler (TEC), respectively. The power area 1202 and battery area 1206 are both directly associated to the heating/cooling effects of external solar loads 1210 and external convection 1212. Power area 1202, in this example, may only need to be kept at approximately 10 degrees Celsius. However, the battery area must be kept above 20 degrees Celsius. Thus, in this non-limiting example, the illustrated components must aid in insuring at battery area 1206 maintain a temperature of at least 20 degrees. Power area 1202 may aid this in transferring heat it receives from the external solar loads 1210. In addition, power area 1202 may also heat battery area 1206 via external convection 1212. Also, on a cold day, heat exchanger 1204 is inactive. This inactivity will aid in keeping heat within the enclosure areas. In addition, TEC 1208 may also aid in warming battery area 1206. Thus, various sources of heat are transferred within areas in the enclosure. The transfer may be via heat pipes, conduction of the area dividers, fans, or devices. As discussed above, the transfer does not require a direct association of an area to a source of heat.

Figure 13:
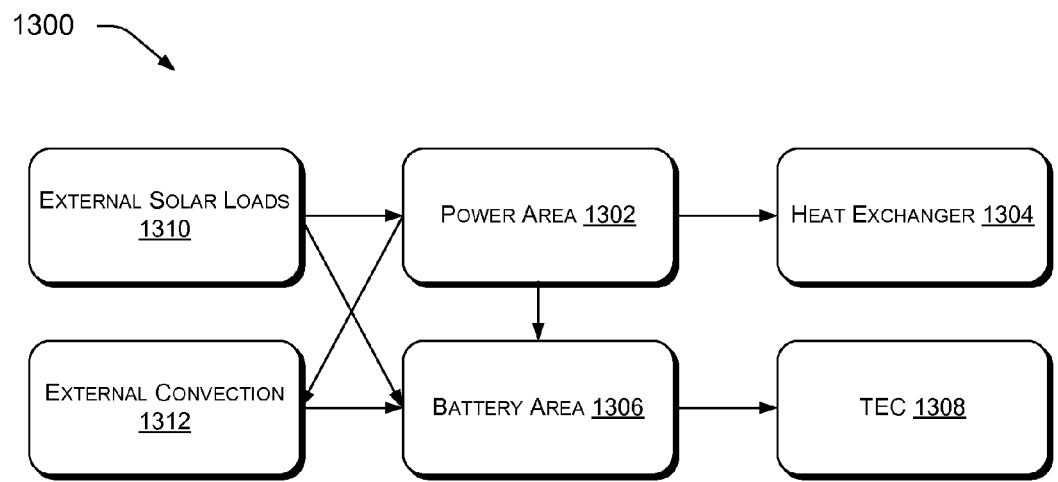
FIG. 13 is a flow chart of an exemplary method of heat distribution within an enclosure in on a hot day.

FIG. 13 illustrates interaction 1300 between airtight areas in an enclosure on a hot day. The associations between areas are similar to FIG. 12. On a hot day, however, battery area may require a temperature of no more than 30 degrees Celsius while power area may only require the area be maintained at 50 degrees. Also on the hot day, external solar loads 1310 and external convection 1312 may be heating both the power area 1302 and battery area 1306. In some instances, the passive heat exchanger 1304 may not be able to sufficiently cool down the power area 1302. Thus, heat may be transferred to battery area 1306. Battery area 1306 may in turn be cooled down by the active TEC system 1308. Put differently, the TEC may cool the battery area 1306 directly, thereby indirectly cooling the adjacent power area 1302. Thus, on a hot day, the sources of heat generation are also transferred within areas of the enclosure so that components not directly associated to an area may nonetheless aid in maintain that area's temperature.

Exemplary Methods

Figure 14:
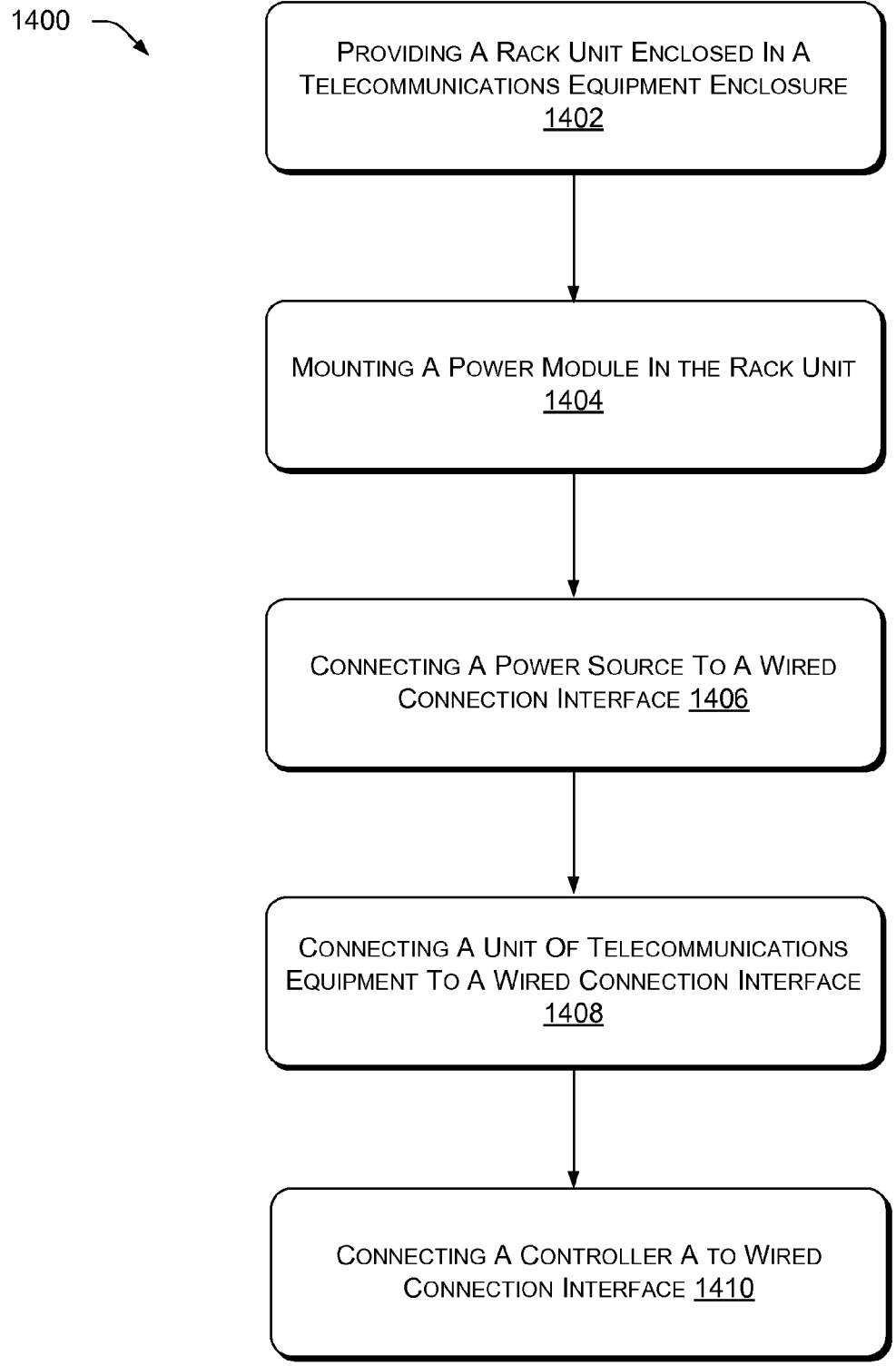
FIG. 14 is flow chart of an exemplary method of configuring a telecommunications equipment enclosure.

FIG. 14 is an exemplary method 1400 of configuring a modular telecommunications equipment enclosure. The method 1400 may, but need not, be implemented using the architecture shown in the previous figures.

At 1402, a rack unit is provided. The rack unit may be enclosed within a telecommunications enclosure. The rack units may also be mounted in a rack. If the enclosure is placed outdoors, the enclosure is suitably configured to protect the interior from weather and other external factors.

As discussed above, the rack unit provides a connecting interface to dock with a wired connection on a power module. At 1404, a power module is mounted in the rack unit. Specifically, the wired connection on the power module docks with the connection interface in the rack unit. A plurality of fasteners may be used to secure the modular enclosure in the rack unit.

At 1406 a power source is connected to the connection interface. For instance, a rectifier may be connected directly to the connection interface or a bus may be used as an intermediary.

At 1408 a unit of telecommunications equipment is connected to the wired connection interface. A plurality of units may be attached to a single connection interface.

Finally, at 1410, a controller is connected to the connection interface. As discussed above, the controller may be housed by the rack, in or housed at a location outside of the rack or even outside of the telecommunications equipment enclosure.

Figure 15:
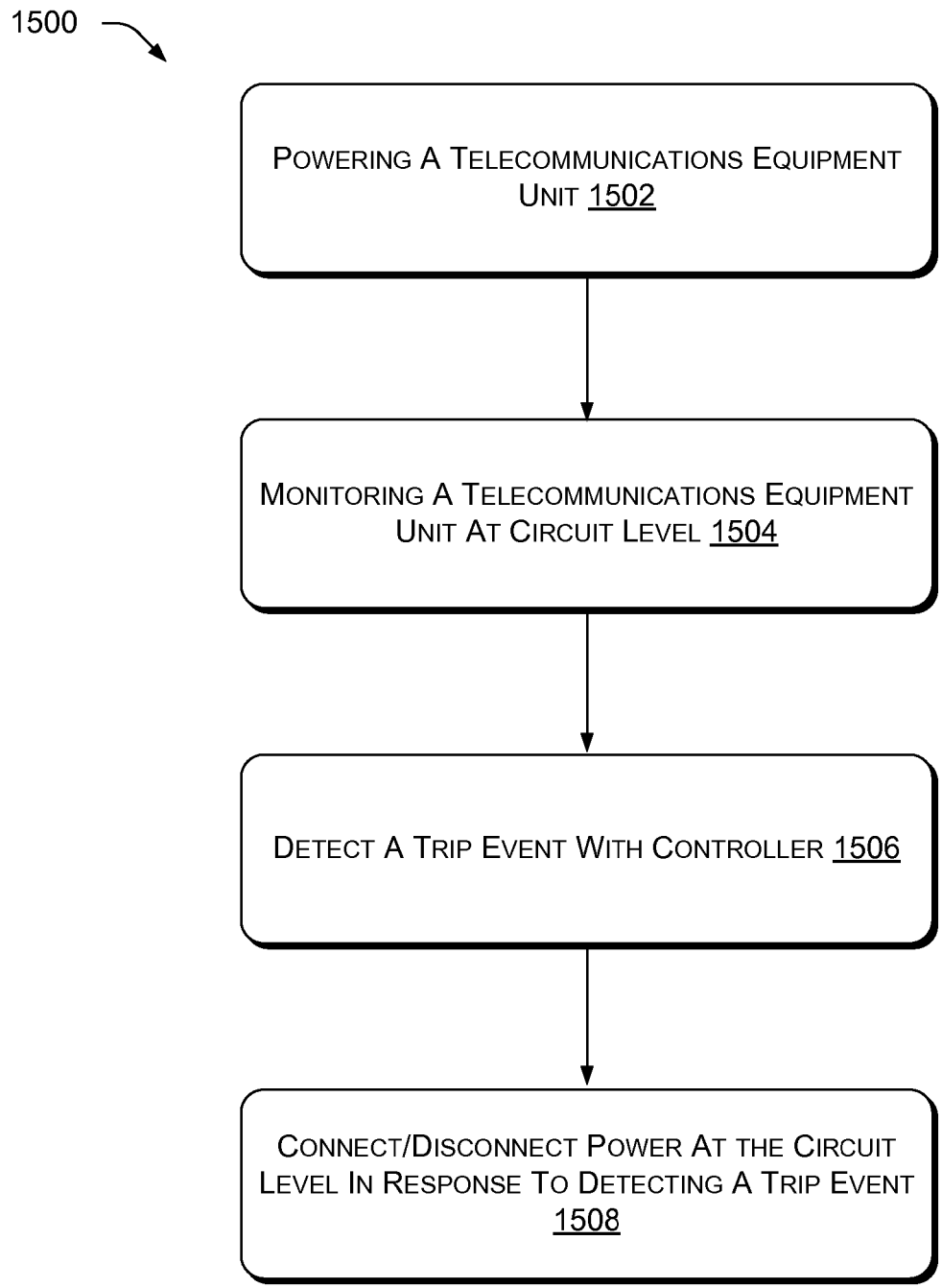
FIG. 15 flow chart of an exemplary method of dynamic power distribution upon detection of a trip event.

FIG. 15 is a flowchart showing an exemplary method 1500 of dynamically managing a telecommunications equipment power module system. The method 1500 may, but need not, be implemented using the architecture shown in FIGS. 1 and 2.

At 1502, a plurality of telecommunications equipment units are powered via DC power. In this instance, a switch is interposed between each equipment unit and the power source.

At 1504, a plurality of telecommunications equipment units are monitored at the circuit level via a monitor coupled to each telecommunications equipment unit load. Each monitor is in communication with a controller from controller system 122. The controller is in communication with each switch. In this instance, the controller is configured to detect the amount of power each particular unit of telecommunications equipment is consuming at the circuit level.

This configuration permits the controller to activate/deactivate any telecommunications equipment unit in a protocol agnostic manner. Specifically, instead of configuring a controller's I/O board to interface with each different and sometimes priority telecommunications equipment unit interface, activation/deactivation is controlled by connecting/disconnecting power to the particular equipment unit.

In one instance, the switch and the monitor are contained within a power module. This modularity makes installation and maintenance less costly and less time consuming. In another instance, the monitor and control connections are in a power module form that may connect to the power source. In this way, the power system is reconfigurable with various different power modules, depending on the particular equipment units at the telecommunications enclosure.

For instance, for dynamic operations, the modules may be equipped with electrically operated power disconnects that allow connection/reconnection of the power output of the module. This connection/reconnection is via a programmable controller that allows the connection/reconnection of the module loads based on DC voltage level, AC power loss, temperature, system current (amp) levels (AC or DC) and/or preset time delays.

In one embodiment, power modules may be connected together. This allows multiple power modules to be used together in a priority configuration where first power module is disconnected at a specific set point, and then, when a second set point is reached, a higher priority power module is disconnected etc., or reconnected in a similar manner.

In other embodiments, power modules may be configured for low voltage control, disconnect and recharge re-connect for battery strings. Recharging may be initiated based on battery voltage levels during AC power outages when the equipment is operating from the batteries.

At 1506, the controller detects a trip event signal. As discussed above, a trip event can be a power outage, a certain temperature within or outside the enclosure, etc. The trip event may be detected by a monitor monitoring a telecommunications equipment unit or a monitor monitoring temperature, humidity, earthquake, weather, security conditions, etc. The local controller is configured to connect/disconnect/inform or take another predetermined action upon detection of a trip event.

At 1508, in response to detecting the trip even signal, the controller may instruct the switch to either connect/disconnect to a unit of telecommunications equipment from the power provided by the power source. In another instance, the trip event may trigger the controller to send information to a remote operations center, turn on a generator or other variety of action in response to the trip event.

Thus, the controller's protocol agnostic ability to connect/disconnect equipment and the ability to monitor equipment at the circuit level, provide dynamic power distribution capability. For instance, the controller is able to identify which units of telecommunications equipment (e.g., which radios) are drawing power on each circuit, and connect/disconnect power to a particular circuit. In other words, the controller has the ability to dynamically connect/disconnect telecommunications equipment at the circuit level via software logic.

LED Lighting System

Figure 16:
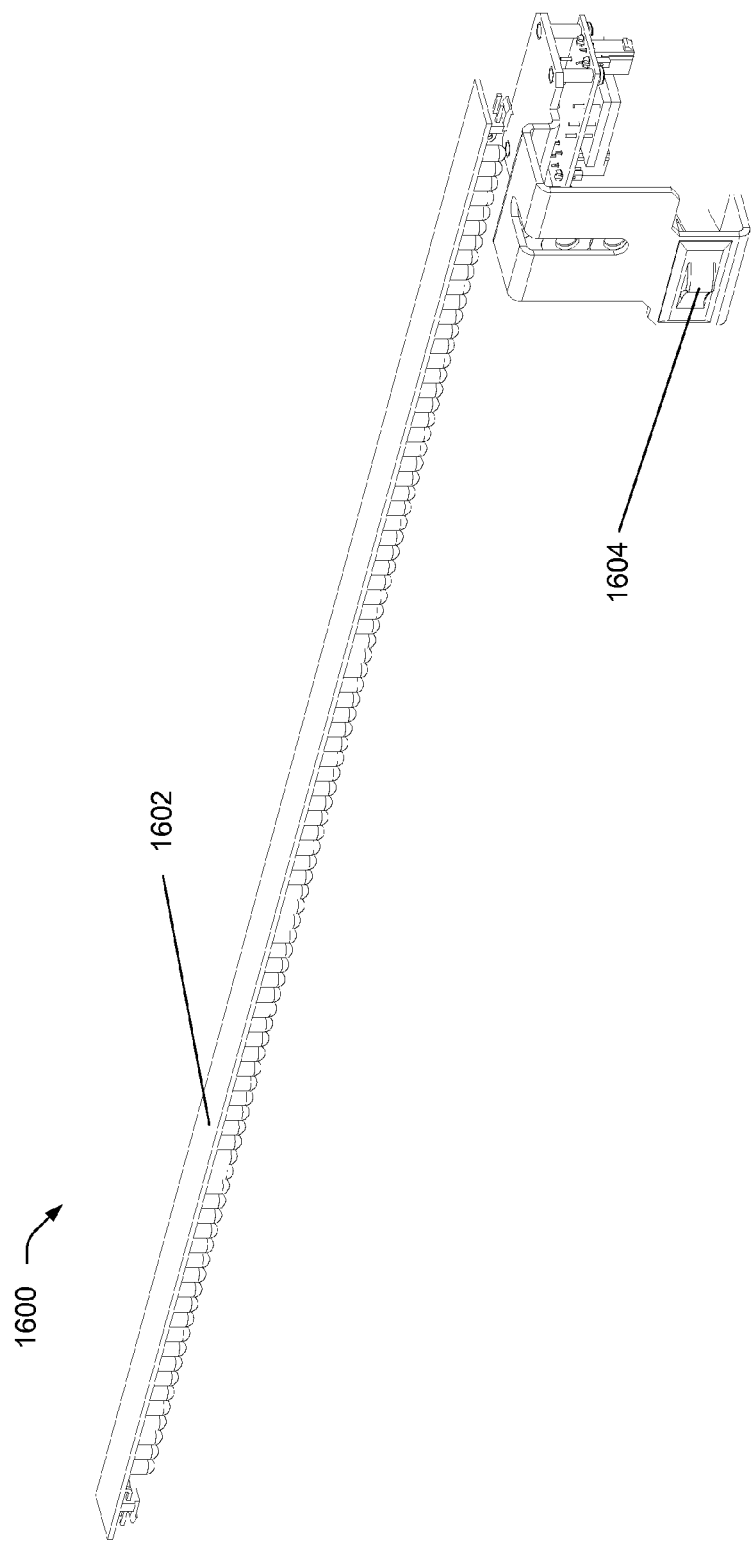
FIG. 16 is a perspective view illustrating an exemplary light emitting diode (LED) illumination system.

FIG. 16 illustrates an LED system 1600. The LED system 1600 is comprised of an LED arm 1602 and a light switch 1604. LED system 1600 provides illumination for a user working within enclosure 300. In one embodiment, the LED system 1600 is installed over the door frame of enclosure 300. Installation may be by a bracket, contact adhesive etc. The LED system may be installed on the rack 320, rack unit 202 or any other surface in or out of the enclosure 300. In another embodiment, an LED system may be installed over the area covered by a subpanel to provide illumination only to that area covered by the subpanel.

LED Arm 1602 provides a plurality of LED bulbs to provide illumination. The ARM may be of any desired length or shape. A user would first activate the light switch 1604, to activate the LED bulbs on LED Arm 1602. This illumination would provide a hands free source of illumination for a user servicing enclosure 300. Illumination is a non-trivial safety factor as the amount of electricity traveling through enclosure 300 may present a significant safety hazard. In one embodiment, the LED system may be powered by DC power.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A telecommunications equipment power module system comprising:
   a rack unit with a connection interface configured to couple to a power source and a unit of telecommunications equipment; and
   a power module configured to mount in the rack unit, the power module comprising:
      a wired connection configured to selectively couple with the connection interface;
      a switch configured to couple with the wired connection and controllably connect and disconnect power between the power source and the unit of telecommunication equipment; and
      a monitor configured to monitor power that the unit of telecommunications equipment consumes from the power source.

2. The module system of claim 1, wherein the connection interface is further coupled to a controller which is in connection with the switch.

3. The module system of claim 2, wherein the controller is configured to direct the switch to control connection of power from the power source to the unit of telecommunications equipment based on detection of a trip event.

4. The module system of claim 2, wherein the controller is configured to direct the switch to disconnect power from the power source to the unit of telecommunications equipment based on detection of a predetermined number of times a circuit breaker is tripped.

5. The module system of claim 2, wherein the power module further houses the controller.

6. The module system of claim 1, the power module further comprising a power distribution block.

7. The module system of claim 1, wherein the rack unit has dimensions of two rack units (2 U).

8. The module system of claim 1, wherein the power module system is enclosed within a telecommunications equipment enclosure.

9. The module system of claim 8, wherein the telecommunications equipment enclosure comprises:

an internal divider configured to substantially separate a first area of the enclosure from a second area of the enclosure;

an access panel configured to allow access to the first area and the second area, the access panel comprising a sub-panel configured to allow access to the first area while preventing access to the second area;

a first lock configured to secure the access panel; and a second lock different than the first lock, the second lock configured to secure the sub-panel.

10. The module system of claim 1, wherein the monitor comprises a shunt.

11. The module system of claim 1, wherein the switch comprises a circuit contactor.

12. A telecommunications equipment power module comprising:

a modular enclosure configured to mount in a space of one rack unit (RU) to five rack units (RU) of a rack, the modular enclosure comprising:

a wired connection configured to selectively couple with a connection interface attached to the rack, the connection interface configured to couple with a unit of telecommunications equipment and a power source;

a controllable switch configured to couple with the wired connection; and a monitor configured to monitor power that the unit of telecommunications equipment consumes from the power source.

13. The module of claim 12, wherein the wired connection is also coupled to a controller which is in connection with the switch.

14. The module of claim 13, wherein the controller is configured to direct the switch to control connection of power from the power source to the unit of telecommunications equipment based on detection of a trip event.

15. The module of claim 13, wherein the controller is configured to direct the switch to disconnect power from the power source to the unit of telecommunications equipment based on detection of a predetermined number of times a circuit breaker is tripped.

16. The module of claim 12, wherein the modular enclosure is enclosed within a telecommunications equipment enclosure.

17. The module of claim 12, the modular enclosure further comprising a power distribution block.

18. The module of claim 12, wherein the monitor comprises a shunt.

19. The module of claim 12, wherein the switch comprises a circuit contactor.

20. The module of claim 12, wherein the modular enclosure is sized to fit in a one rack unit (1 U) space.

21. The module of claim 12, wherein the modular enclosure is sized to fit in a two rack unit (2 U) space.

22. A telecommunications equipment power module system comprising:

a rack unit with a connection interface configured to couple to a power source and a unit of telecommunications equipment;

a power module configured to mount in the rack unit, the power module comprising:

a wired connection configured to selectively couple with the connection interface;

a switch configured to couple with the wired connection; and a monitor configured to monitor power that the unit of telecommunications equipment consumes from the power source, and a weather proof enclosure enclosing the rack unit and the power module, and having a door configured to cover and seal an opening of the weather proof enclosure with a sealing material.

* * * * *